United States Patent
Carter et al.

(10) Patent No.: US 10,574,137 B2
(45) Date of Patent: Feb. 25, 2020

(54) METHOD FOR DYNAMICALLY REDUCING PEAK ELECTROMAGNETIC INTERFERENCE FROM A GROUP OF SWITCHING DEVICES CONNECTED ON A COMMUNICATIONS BUS

(71) Applicant: SCHNEIDER ELECTRIC USA, INC., Andover, MA (US)

(72) Inventors: Michael Carter, Clayton, NC (US); Kevin M Jefferies, Raleigh, NC (US); Benjamin W Edwards, Rolesville, NC (US)

(73) Assignee: Schneider Electric USA, Inc., Andover, MA (US)

( * ) Notice: Subject to any disclaimer, the term of this patent is extended or adjusted under 35 U.S.C. 154(b) by 66 days.

(21) Appl. No.: 15/793,392

(22) Filed: Oct. 25, 2017

(65) Prior Publication Data
US 2019/0124801 A1 Apr. 25, 2019

(51) Int. Cl.
| | |
|---|---|
| *H02M 1/44* | (2007.01) |
| *H05K 9/00* | (2006.01) |
| *H04B 15/02* | (2006.01) |
| *H02K 11/02* | (2016.01) |
| *H03K 17/94* | (2006.01) |

(Continued)

(52) U.S. Cl.
CPC .............. *H02M 1/44* (2013.01); *H02K 11/02* (2013.01); *H03K 17/30* (2013.01); *H03K 17/94* (2013.01); *H04B 15/02* (2013.01); *H05K 9/0071* (2013.01); *G05F 7/00* (2013.01); *H03K 2217/0081* (2013.01); *H03K 2217/94* (2013.01)

(58) Field of Classification Search
CPC ...... H05K 9/0071; H02K 11/02; H03K 17/30; H03K 17/94; H03K 2217/0081; H03K 2217/94; H04B 15/02; G05F 7/00
USPC ................................................ 333/17.1, 17.2
See application file for complete search history.

(56) References Cited

U.S. PATENT DOCUMENTS

| 6,674,789 B1 | 1/2004 | Fardoun et al. |
|---|---|---|
| 8,767,867 B1 | 7/2014 | Castor-Perry |
| 2004/0090802 A1 | 5/2004 | Pourseyed et al. |

(Continued)

OTHER PUBLICATIONS

Microcontroller Tutorial II, Timers, Published as a lecture note by IIT Kanpur, India, Aug. 2016 (Year: 2016).*

(Continued)

*Primary Examiner* — Benny T Lee
*Assistant Examiner* — Hafizur Rahman
(74) *Attorney, Agent, or Firm* — Locke Lord LLP (57) ABSTRACT

The system and method for dynamically reducing the peak electromagnetic interference produced by a group of electrical or electronic switching devices connected to a common communications bus. The system and method includes a fixed range of frequencies that includes frequencies emitted by the group of switching devices during normal operation and subranges of frequencies within the fixed range of frequencies, each subrange of frequencies being associated with a unique bus address of one switching device in the group of switching devices. Each subrange of frequencies being determined by the unique bus address of its associated switching device and characteristic weights dynamically determined and/or assigned to its associated switching device and/or load by a microprocessor implemented algorithm.

17 Claims, 8 Drawing Sheets

(51) Int. Cl.
    *H03K 17/30*     (2006.01)
    *G05F 7/00*     (2006.01)

(56) References Cited

U.S. PATENT DOCUMENTS

2009/0086518 A1*   4/2009   Currie .................... H02M 1/12
                                                                                        363/125
2016/0134326 A1     5/2016   Lee et al.

OTHER PUBLICATIONS

Cao, Zhiwen, et al., "Variable Frequency Modulation for EMI Suppressing in Power Converter", Energy and Power Engineering, 2013, pp. 1147-1152.
PFS704-729EP HiperPFS Family, High Power PFC Controller with Integrated High-Voltage MOSFET, power integrations, Jun. 2015, 31 pages.
Heminger, Mark, "Spread-Spectrum Clock Source Using an MSP430", Texas Instruments, Application Report SLAA291-May 2006, pp. 1-16.
Qu, Yunsheng, "Frequency Dithering with the UCC28180 and TLV3201", Texas Instruments, Application Report SLUA704—Mar. 2014, pp. 1-12.
Extended European Search Report for European Patent Application No. 18202050.3 dated Mar. 22, 2019, 16 pages.

\* cited by examiner

| fixed range of frequencies 50 minimum frequency 82 (low end) | fixed range of frequencies 50 maximum frequency 86 (high end) | bus address 42 | characteristics 58 → |  |  |  |
|---|---|---|---|---|---|---|
|  |  |  | switching device 38 state 0=OFF or 1=ON | load 106 normal or heavy 0 or 1 | current normal or high 0 or 1 | switching device 38 type contactor 0 or 1 |
| 20 | 30 | 1 | 1 | 1 | 0 | 1 |
|  |  | 2 | 0 | 1 | 1 | 0 |
|  |  | 3 | 1 | 0 | 0 | 0 |

| → characteristics 58 | | sum of weightings 66 for each ON switching device address 42 | determined frequency range 94 for each weighting 66 | minimum frequency 114 of the subrange of frequencies 54 | subrange of frequencies 54 | maximum frequency 110 of the subrange of frequencies 54 |
|---|---|---|---|---|---|---|
| switching device type 38 power supply 0 or 1 | switching device 38 type drive 0 or 1 |  |  |  |  |  |
| 0 | 0 | 3 | 2.000 | 20.000 | 6.000 | 26.000 |
| 0 | 1 | 0 |  | 26.000 | 0.000 | 26.000 |
| 1 | 0 | 2 |  | 26.000 | 4.000 | 30.000 |

Figure 3A

| fixed range of frequencies 50 minimum frequency 82 (low end) | fixed range of frequencies 50 maximum frequency 86 (high end) | bus address 42 | characteristics 58 →  | | | |
|---|---|---|---|---|---|---|
| | | | switching device 38 state 0=OFF or 1=ON | load 106 normal or heavy 0 or 1 | current normal or high 0 or 1 | switching device 38 type contactor 0 or 1 |
| 20 | 30 | 1 | 1 | 1 | 0 | 1 |
| | | 2 | 1 | 1 | 1 | 0 |
| | | 3 | 1 | 0 | 0 | 0 |

| characteristics 58 | | | | | | |
|---|---|---|---|---|---|---|
| switching device 38 type power supply 0 or 1 | switching device 38 type drive 0 or 1 | sum of weightings for each ON switching device address 42 | determined frequency range 94 for each weighting 66 | minimum frequency 114 of the subrange of frequencies 54 | subrange of frequencies 54 | maximum frequency 110 of the subrange of frequencies 54 |
| 0 | 0 | 3 | 1.111 | 20.000 | 3.333 | 23.333 |
| 0 | 1 | 4 | 4 | 23.333 | 4.444 | 27.778 |
| 1 | 0 | 2 | 3 | 27.778 | 2.222 | 30.000 |

Figure 3B

| fixed range of frequencies 50 minimum frequency 82 (low end) | fixed range of frequencies 50 maximum frequency 86 (high end) | bus address 42 | characteristics 58 → switching device 38 state 0=OFF or 1=ON | load 106 normal or heavy 0 or 1 | current normal or high 0 or 1 | switching device 38 type contactor 0 or 1 |
|---|---|---|---|---|---|---|
| 20 | 30 | 1 | 1 | 1 | 0 | 1 |
|  |  | 2 | 1 | 1 | 1 | 0 |
|  |  | 3 | 1 | 1 | 1 | 0 |

| characteristics 58 → switching device 38 type power supply 0 or 1 | switching device 38 type drive 0 or 1 | sum of weightings for each ON switching device address 42 | determined frequency range 94 for each weighting 66 | minimum frequency 114 of the subrange of frequencies 54 | Subrange of frequencies 54 | maximum frequency 110 of the subrange of frequencies 54 |
|---|---|---|---|---|---|---|
| 0 | 0 | 3 | 0.909 | 20.000 | 2.727 | 22.727 |
| 0 | 1 | 4 |  | 22.727 | 3.636 | 26.364 |
| 1 | 0 | 4 |  | 26.364 | 3.636 | 30.000 |

METHOD FOR DYNAMICALLY REDUCING PEAK ELECTROMAGNETIC INTERFERENCE FROM A GROUP OF SWITCHING DEVICES CONNECTED ON A COMMUNICATIONS BUS

FIELD OF THE INVENTION

The invention is generally directed to electrical or electronic switching devices and particularly to the intensity of the electromagnetic interference produced by multiple switching devices in a system.

BACKGROUND OF THE INVENTION

Systems having multiple electrical or electronic switching devices are common. These systems can include switching devices such as power supplies, drives, motor controllers, soft starters, protection devices or any electrical or electronic device that includes a switching element that can produce an electromagnetic signal during normal operation. If these switching devices are operating independently within the system, there is no means to coordinate switching frequencies between the individual devices in the system. Therefore, some devices may switch at the same frequency or at harmonics of other switching devices (overlapping frequencies) in the system, thereby concentrating electromagnetic emissions into a small frequency range(s), which causes a peak in electromagnetic emissions. These peak electromagnetic emissions can cause problems in other electronic devices or degrade their operating efficiency. Peak electromagnetic emissions may also exceed electromagnetic compatibility (EMC) regulations. Therefore, a relatively simple and inexpensive method of reducing the peak electromagnetic interference (EMI) produced by systems having multiple electrical or electronic switching device is desirable.

SUMMARY OF THE INVENTION

The present invention provides a method for dynamically reducing the peak EMI produced by systems that have multiple electrical or electronic switching devices. The system includes:
a controller having a microprocessor and a non-transitory memory associated with the microprocessor, the non-transitory memory storing an algorithm implemented by the microprocessor and characteristics of the switching devices and/or loads controlled by the switching devices;
a fixed range of frequencies, the fixed range of frequencies including frequencies emitted by the group of switching devices during normal operation;
a subrange of frequencies for each switching device in the group of switching devices, each subrange of frequencies being dynamically determined by the characteristics of its associated switching device and/or the load controlled by the switching device; and
a timer associated with each switching device, the timer using a maximum and a minimum frequency of the subrange of frequencies associated with its associated switching device to spread the peak frequency of that associated switching device over its associated subrange of frequencies.

The invention also teaches a method for dynamically reducing a peak electromagnetic interference produced by a group of switching devices connected to a common communications bus, the method comprising:
determining a fixed range of frequencies, the fixed range of frequencies including frequencies emitted by the group of switching devices during normal operation;
determining, by a microprocessor, a subrange of frequencies associated with each switching device in the group of switching devices, each subrange of frequencies being dynamically determined by one or more characteristics of its associated switching device and/or a load controlled by its associated switching device; and
spreading the peak frequency of each switching device over its associated subrange of frequencies by a timer associated with the switching device and using a maximum and a minimum frequency of the associated subrange of frequencies.

DETAILED DESCRIPTION OF THE EMBODIMENTS

Figure 1:
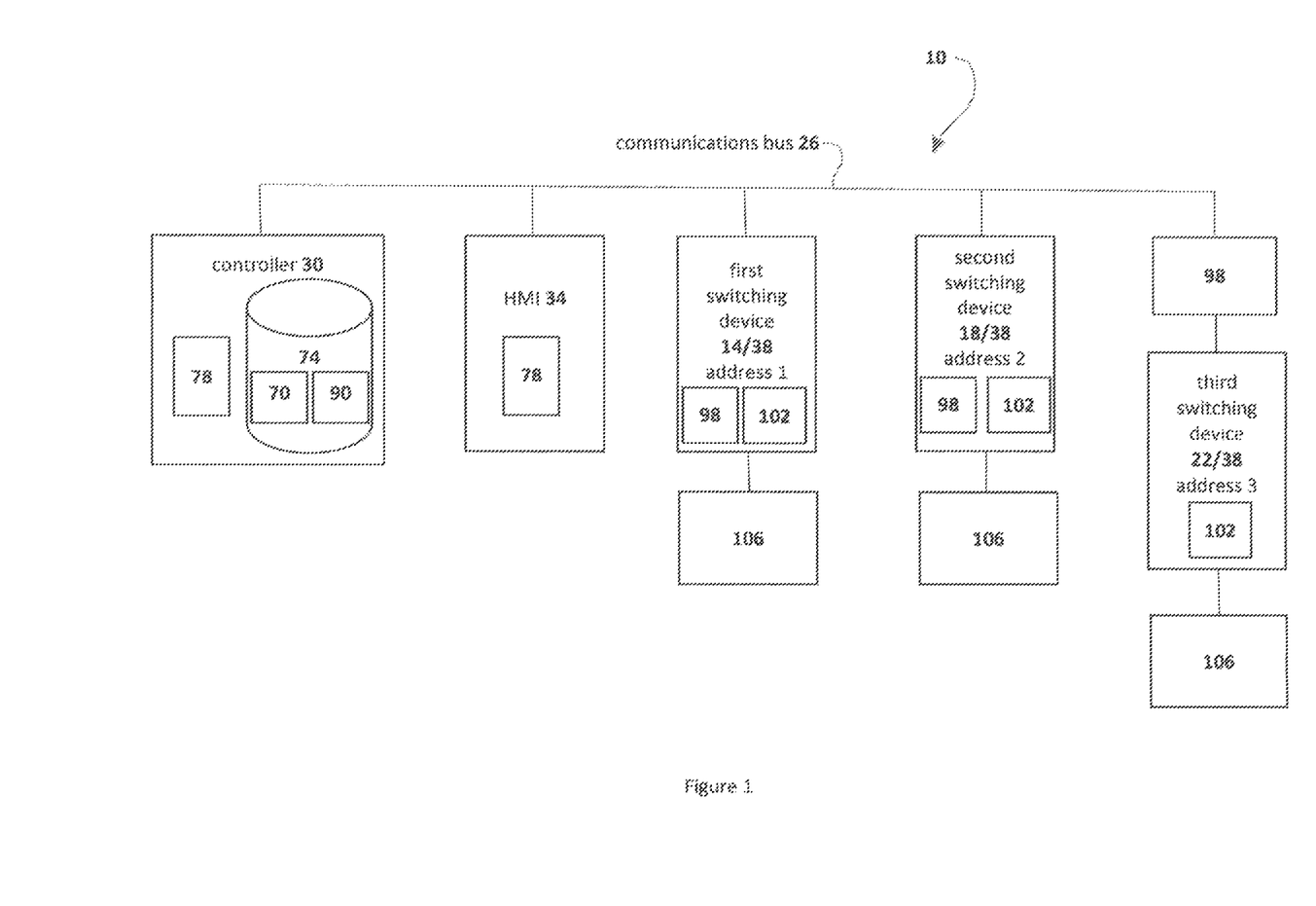
FIG. 1 illustrates a typical system having a group of switching devices connected by a communications bus.

Referring now to FIG. 1, a system for dynamically reducing the peak electromagnetic interference produced by a group of switching devices is generally indicated by reference number 10. The system 10 includes first switching device 14, second switching device 18, and third switching device 22, each connected to a communications bus 26. A controller 30, and/or a human machine interface (HMI) 34, can also be connected to the communications bus 26 but are not required for the system 10 to reduce the peak electromagnetic interference produced by a group of switching devices, collectively indicated by reference number 38. A non-transitory memory 74 and processor 78 are shown in the controller 30, however, they can also be located in the HMI 34 or switching devices 38. Each switching device 38 also includes an associated timing device such as a clock, timer, oscillator or other means capable of providing evenly spaced intervals of time, generally indicated as timer 98. The timer 98 can be located in the switching device 38 or between the processor 78 and switching device 38. The switching devices 38 can also include a basic processor 102 for performing minor operations related to algorithms 70 and 90. It is further understood that the system 10 is for the purpose of disclosing the present invention and does not limit or restrict the number of switching devices 38, in the system 10. The communications bus 26 provides a means for communication between the switching devices 38. Therefore, each switching device 38 is associated with a unique bus address 42. The bus addresses 42 can be any symbol or term that can be translated to a numeric value. It is also to be understood that the bus addresses 42 of switching devices 38 can be designed into the switching devices 38 during manufacturing, manually set by switches or similar means on the switching devices 38, determined by the position of the switching devices 38 on the communication bus 26 or programed over the communications bus 26 by the controller 30 or a user 46 through the HMI 34.

Figure 2A:
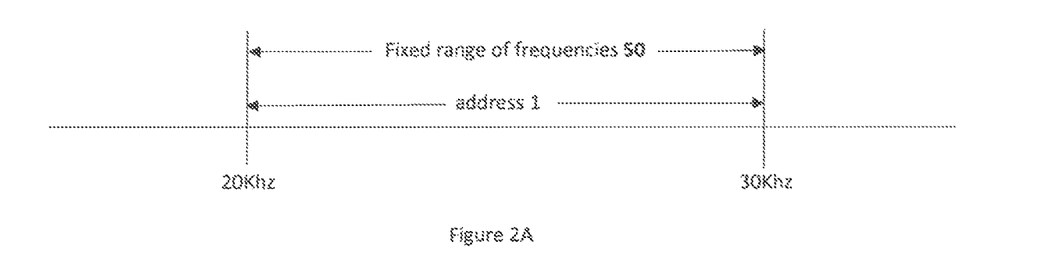
FIGS. 2A-2C graphically illustrates a fixed range of frequencies with one to three subranges of frequencies defined by the switching device bus address.
Figure 2B:
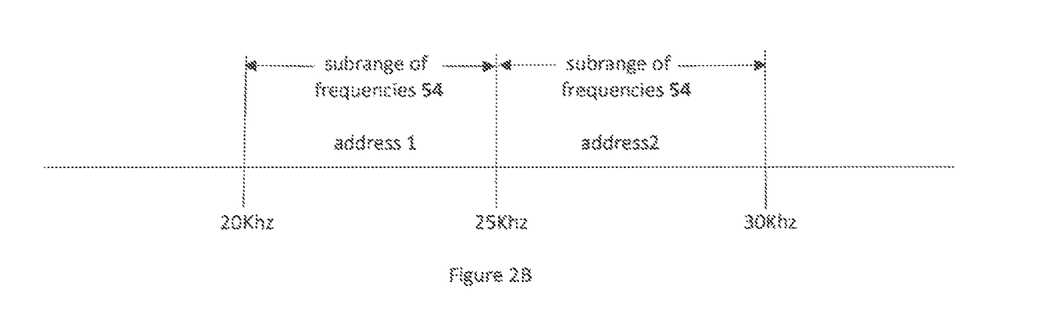
Figure 2C:
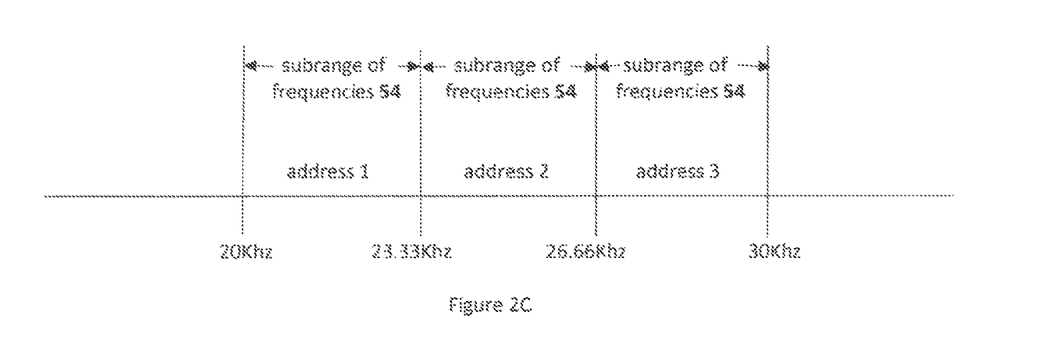

The system 10 has a fixed range of frequencies 50, for example the range between 20 kHz and 30 kHz, as shown in FIGS. 2A-2C. The fixed range of frequencies 50 is generally selected by the user 46, and can be determined by the known or expected frequencies produced by the group of switching devices 38. The known or expected frequencies of the switching devices 38 can be provided by their manufacturer or determined from observations during operation of the switching devices 38. In the exemplary system 10 of FIG. 1, the bus addresses 42 have been assigned by the position of the switching devices 38 on the communication bus 26. Therefore, first switching device 14 has been assigned bus address 1, second switching device 18 has been assigned bus address 2 and third switching device 22 has been assigned bus address 3. The bus addresses 42 can also be assigned based on the known or expected frequencies of the switching devices 38 with respect to the fixed range of frequencies 50. For example, a switching device 38 known or expected to produce a switching frequency near the upper end of the fixed range of frequencies 50 could be assigned a higher bus address 42 than other switching devices 38 connected to the communications bus 26, regardless of its position on the communications bus 26. In this simple method for reducing the peak electromagnetic interference the fixed range of frequencies 50 is divided into equal subranges of frequencies 54, each subrange of frequencies 54 being associated with a unique bus address 42 and its associated switching device 38. The range of frequencies included in each subrange of frequencies 54 is determined by the range of frequencies in the fixed range of frequencies 50 and the number of switching devices 38 connected to the communications bus 26. In the example of FIG. 2A, only first switching device 14 is connected to the communications bus 26. Using only the switching devices' 38 bus addresses 42, a subrange of frequencies 54 can be determined for each switching device 38 connected to the communications bus 26. Since the first switching device 14 is the only switching device 38 connected to the communications bus 26 in FIG. 2A, it can access the full range of the fixed range of frequencies 50. In FIG. 2B, the second switching device 18 is added to the communications bus 26, and the fixed range of frequencies 50 is divided into two equal subranges of frequencies 54, one for each of the first and second switching devices, 14 and 18 respectively. In FIG. 2C, the third switching device 22 is added to the communications bus 26, and the fixed range of frequencies 50 is divided into three equal subranges of frequencies 54, one for each of the connected first, second and third switching devices, 14, 18 and 22 respectively. In this simple method of reducing peak electromagnetic interference, as new switching devices 38 are added to the communications bus 26 new subranges of frequencies 54 will be created in the fixed range of frequencies 50. To maintain the determined fixed range of frequencies 50 as new subranges of frequencies 54 are created, the range of frequencies in each of the subranges of frequencies 54 will automatically be reduced. Alternatively, if the number of switching devices 38 connected to the communications bus 26 is decreased, the range of frequencies in each of the subranges of frequencies 54 will automatically be increased.

Figure 3A:
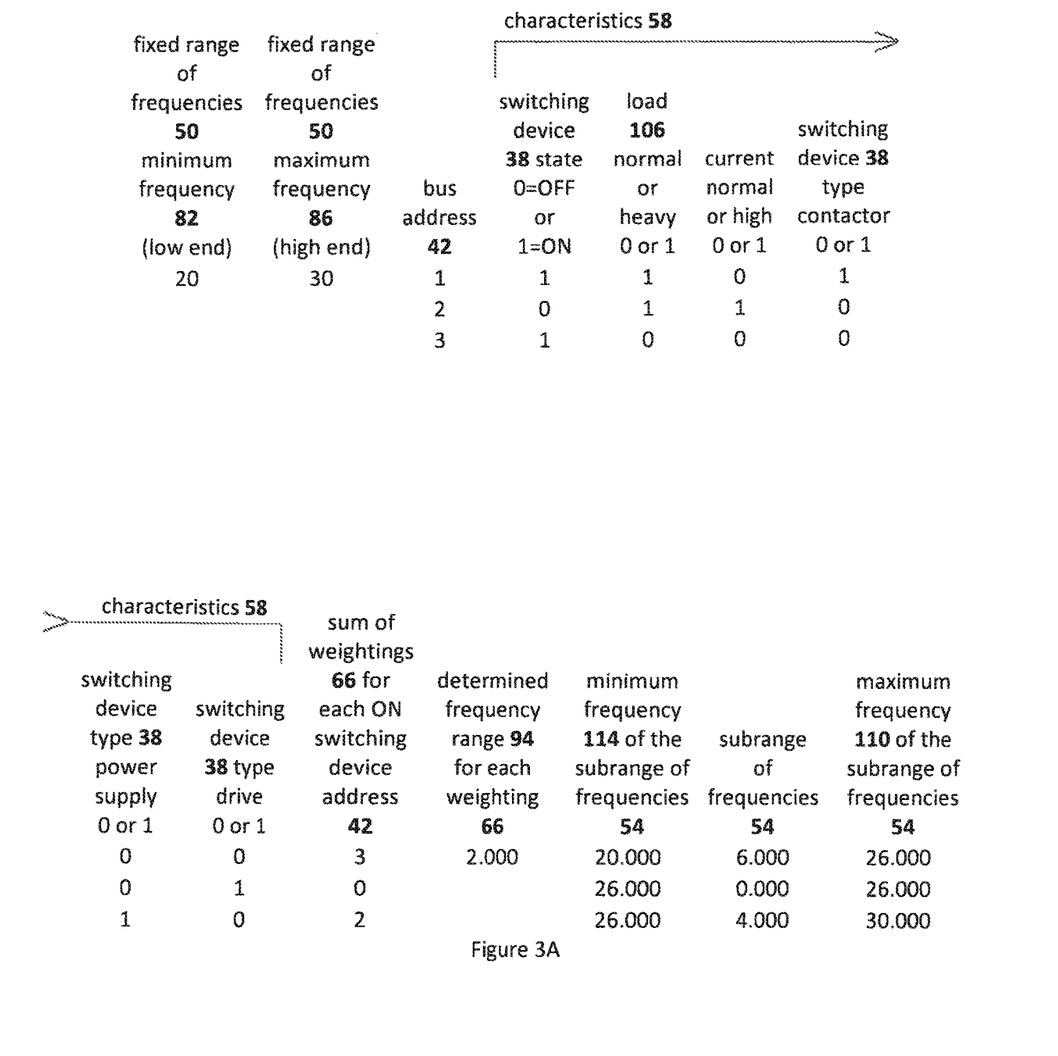
FIGS. 3A-3C illustrate tables used to dynamically determine the subranges of frequencies graphically illustrated in FIGS. 4A-4C.
Figure 3B:
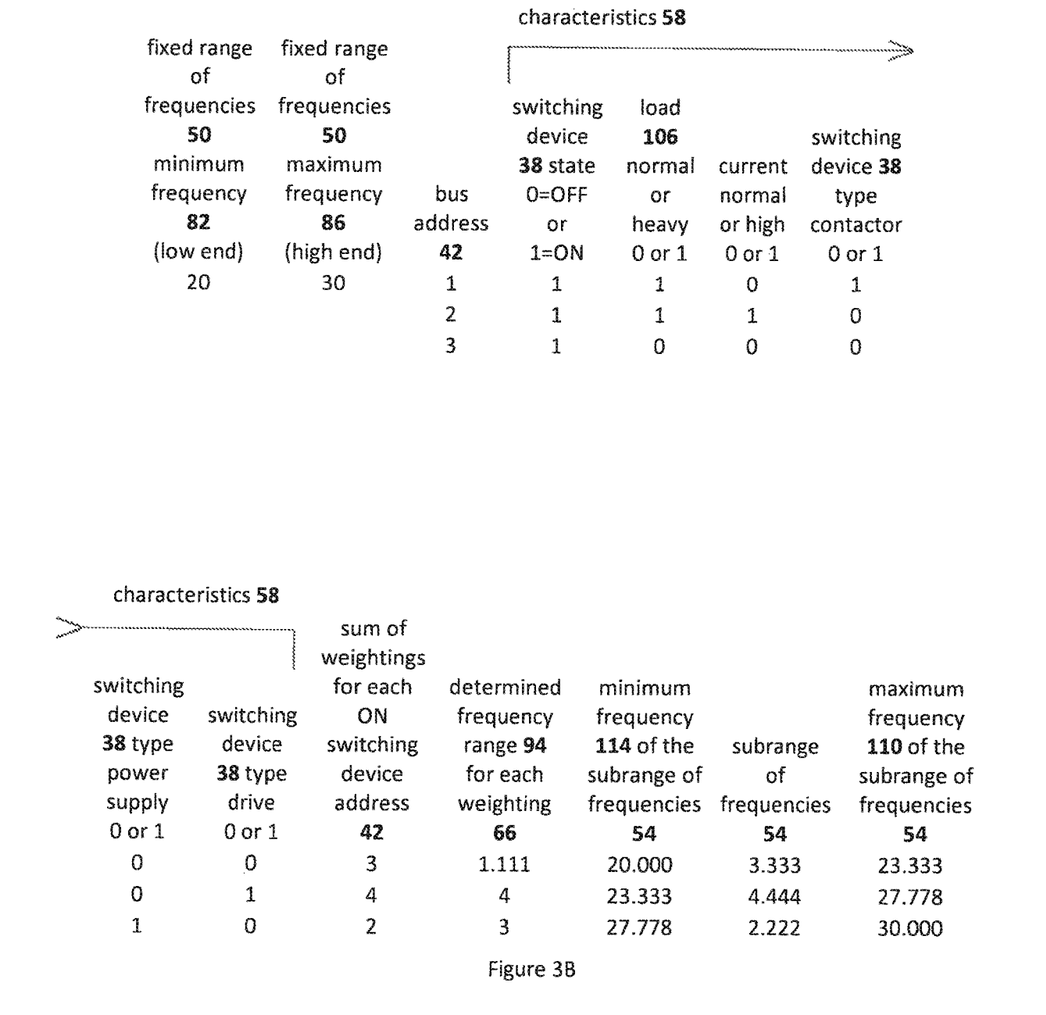
Figure 3C:
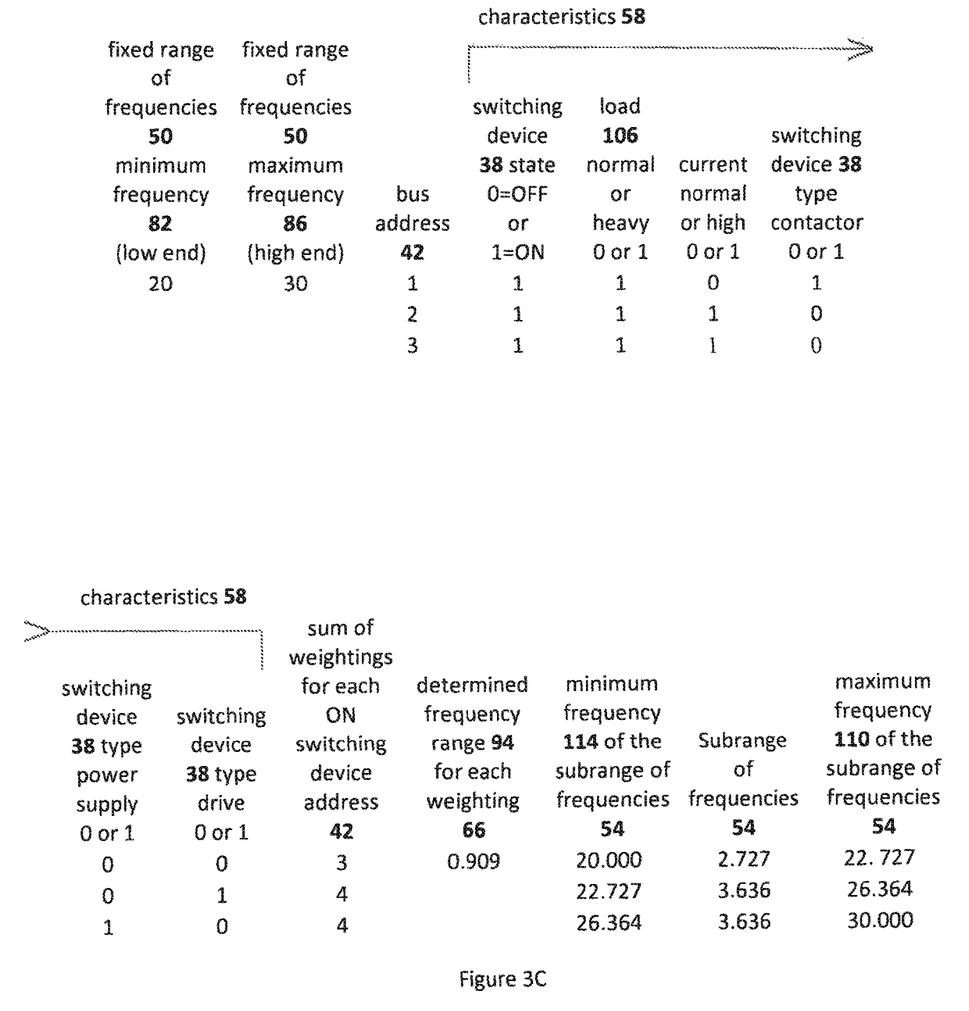

Referring now to FIGS. 3A-3C, a method is disclosed for dynamically reducing the peak electromagnetic interference produced by the system 10. The dynamic method can alter, in real time, all of the subranges of frequencies 54 within a fixed range of frequencies 50, in response to a change in any static or dynamic characteristic 58 of one or more of the switching devices 38 connected to the communications bus 26 and/or loads 106 controlled by the switching devices 38. The static characteristic 58 can include but are not limited to the type of switching device 38 (contactor, drive, power supply, etc.) and type of load 106 being controlled (motor etc.). The dynamic characteristics 58 can be sensed or calculated characteristics, which include but are not limited to the ON or OFF state of the switching device 38, a current level controlled by the switching device 38 (normal or high), voltage, power and, in some cases, the load 106 controlled by the switching device 38 (normal or heavy). These characteristics 58 are indicated in a table 62 by binary (0 or 1) weights 66 and, in some special cases where the characteristic 58 can include varying degrees (high, medium low, etc.), can include the numerals 2-9. The table 62 and algorithms 70 and 90 for processing information from the table 62 are stored in the non-transitory memory 74, the algorithms 70 and 90 being implemented by the processor 78. Algorithm 70 dynamically reduces the peak electromagnetic interference produced by switching devices 38 in the system 10 in real time. Algorithm 90 evaluates the weights 66 associated with each bus address 42 to determine a subrange of frequencies 54 for each bus address 42 and its associated switching device 38 connected to the communications bus 26. The algorithm 70 for dynamically reducing the peak electromagnetic interference produced by each switching device 38 in the system 10 and algorithm 90 for determining the subrange of frequencies 54 for each bus address 42 and its associated switching device 38 connected to the communications bus 26 will be explained in greater detail below.

Figure 4A:
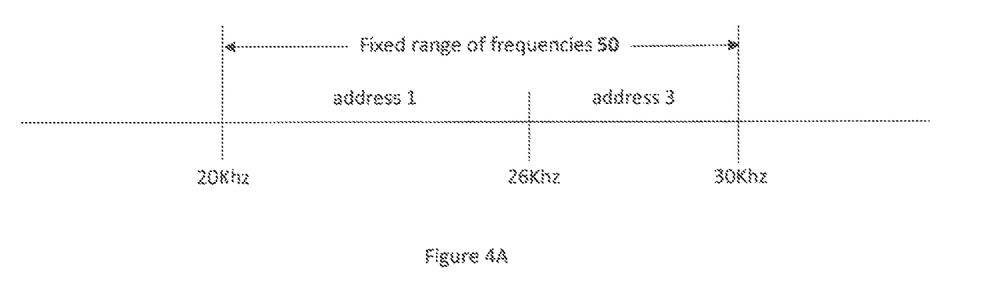
FIGS. 4A-4C graphically illustrates subranges of frequencies defined by the weights assigned to each switching device as shown in the table of FIGS. 3A-3C.
Figure 4B:
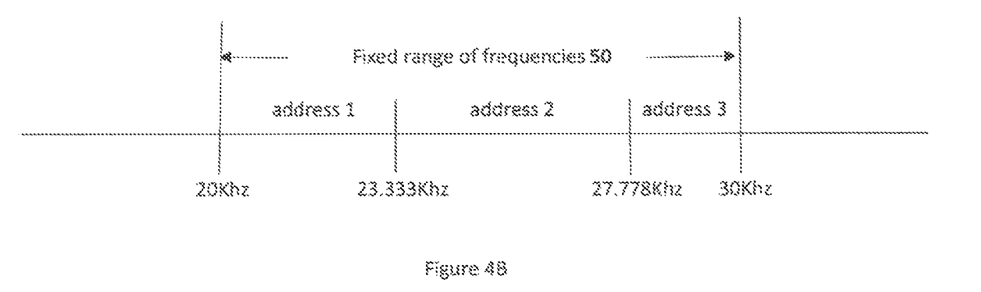
Figure 4C:
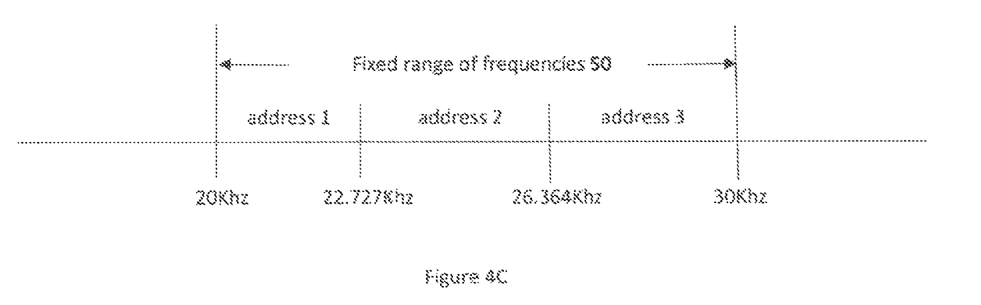

FIGS. 3A-3C illustrate three example tables 62 for the first, second and third switching devices, 14, 18 and 22 respectively, of FIG. 1. Each example table 62 has a different configuration of characteristics 58 and their associated weights 66 for each of the first, second and third switching devices, 14, 18 and 22 respectively. In FIG. 3A, bus address 1 (first switching device 14) is in an ON state, has a heavy load 106 and is a contactor. Therefore, address 1 has a total weighting 66 of 3. Bus address 2 (second switching device 18) is in an OFF state has a heavy load 106, high current and is a drive, but has a weighting 66 of zero because it is in an OFF state. Bus address 3 (third switching device 18) is in an ON state and is a power supply, and has a total weighting 66 of 2. The subranges of frequencies 54 for addresses 1, 2 and 3 are graphically illustrated in FIG. 4A where the subrange of frequencies 54 for address 1 is 6 Khz, the subrange of frequencies 54 for address 2 is 0 Khz, and subrange of frequencies 54 for address 3 is 4 Khz. In FIG. 3B, addresses 1, 2 and 3 have the same characteristics 58 as in FIG. 3A except that address 2 is now in an ON state and has a total weighting 66 of 4. As shown graphically in FIG. 4B, the subrange of frequencies 54 for address 1 is now 3.333 Khz, the subrange of frequencies 54 for address 2 is now 4.444 Khz, and the subrange of frequencies 54 for address 3 is now 2.222 Khz. In FIG. 3C, addresses 1 and 2 have the same characteristics 58 as in FIG. 3B. However, address 3 now has characteristics 58 for a heavy load 106 and high current resulting in a total weighting 66 of 4. As shown graphically in FIG. 4C, the subrange of frequencies 54 for address 1 is now 2.727 Khz, the subrange of frequencies 54 for address 2 is now 3.636 Khz, and the subrange of frequencies 54 for address 3 is now 3.636 Khz.

Figure 5:
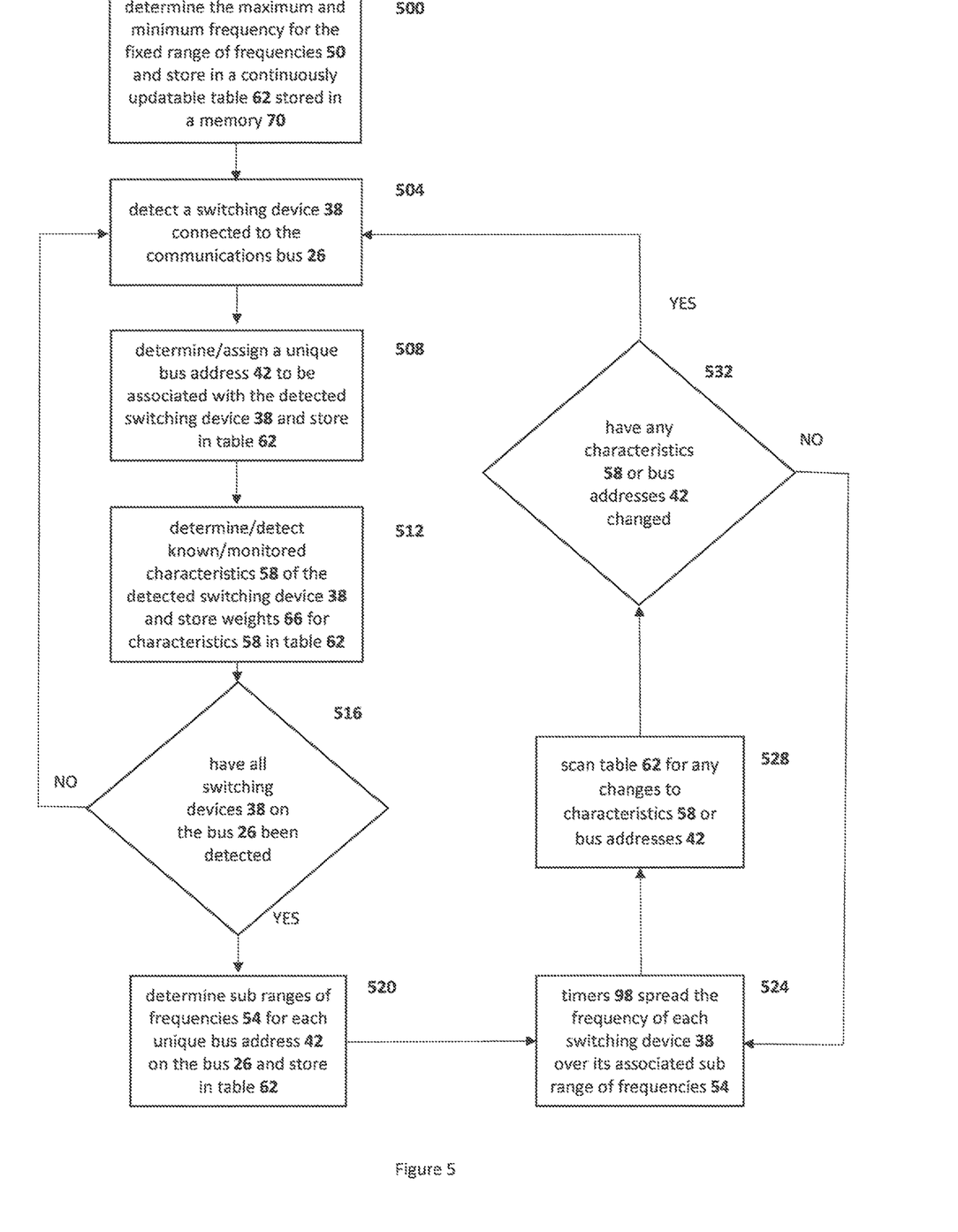
FIG. 5 is a flow chart of the method for dynamically reducing the peak electromagnetic interference produced by the system.

Referring now to FIG. 5, a flow chart of the algorithm 70 for dynamically reducing the peak electromagnetic interference from a group of switching devices 38 is shown. At step 500 a user 46 determines the minimum frequency 82 and maximum frequency 86 for the fixed range of frequencies 50 in which the group of switching devices 38 connected to the communications bus 26 will operate. The operating frequencies produced by the switching devices 38 is generally provided by the manufacturer or can be determined by monitoring the switching devices 38 during operation. The determined minimum 82 and maximum 86 frequencies are stored in table 62. Although it is not normally required, the range of the fixed range of frequencies 50 can be adjusted by changing one or both of the minimum 82 and maximum 86 frequencies in table 62. For example, the addition of a switching device 38 that operates outside the current fixed range of frequencies 50 to the communications bus 26 or removal from the communications bus 26 of a switching device 38 operating at the extreme minimum 82 or maximum 86 of the fixed range of frequencies 50 can initiate a change in the fixed range of frequencies 50. At step 504, the processor 78 detects the first switching device 38 on the communications bus 26. At step 508 the processor determines if the detected switching device 38 has a unique bus address 42, if no unique bus address 42 is detected a unique bus address 42 will be assigned by the processor 78 or user 46. The unique bus address 42 associated with the detected switching device 38 is stored in table 62. At step 512, the processor 78 detects and/or determines static and/or dynamic characteristics 58 of the detected switching device 38. The static and/or dynamic characteristics 58 are stored in table 62 such that they are associated with the unique bus address 42 of the detected switching device 38. At step 516, the processor 78 determines if all of the switching devices 38 connected to the communications bus 26 have been detected and processed through steps 508 and 512. If the result of the determination at step 516 is NO, steps 504 through 516 are repeated until all switching devices 38 connected to the communications bus 26 have been processed. If the result of the determination at step 516 is YES, the processor 78 proceeds to step 520 where the subrange of frequencies 54 for each unique bus address 42 is determined and stored in table 62 such that each determined subrange of frequencies 54 is associated with its unique bus address. The process for dynamically determining each subrange of frequencies 54 will be described in detail with respect to FIG. 6. At step 524, once the subrange of frequencies 54 for each switching device 38 has been determined, one of the processors 78 or 102 can determine the dithering duty cycle for each switching device 38 connected to the communications bus 26 by using the maximum frequency 110 and minimum frequency 114 of the subrange frequencies 54 associated with each switching device 38 connected to the communications bus 26. For example, the dithering duty cycle can be determined by dividing the frequency of timer 98 associated with a particular switching device 38 by the maximum frequency 110 and/or minimum frequencies 114 of the subrange of frequencies 54 associated with that particular switching device 38. This determines the number of ticks (half cycles) of timer 98 over which the frequency of the timer's 98 associated switching device 38 will be spread. The timer 98 then controls the ON time of its associated switching device 38 using the determined number of ticks. At step 528, processor 78 scans table 62 for any changes to the switching device 38 characteristics 58 or bus addresses 42. At step 532, if no changes are discovered the processor 78 returns to step 524 of algorithm 70. If any changes to characteristics 58 or bus addresses 42 are discovered at step 528 the processor 78 returns to step 504 of algorithm 70.

Figure 6:
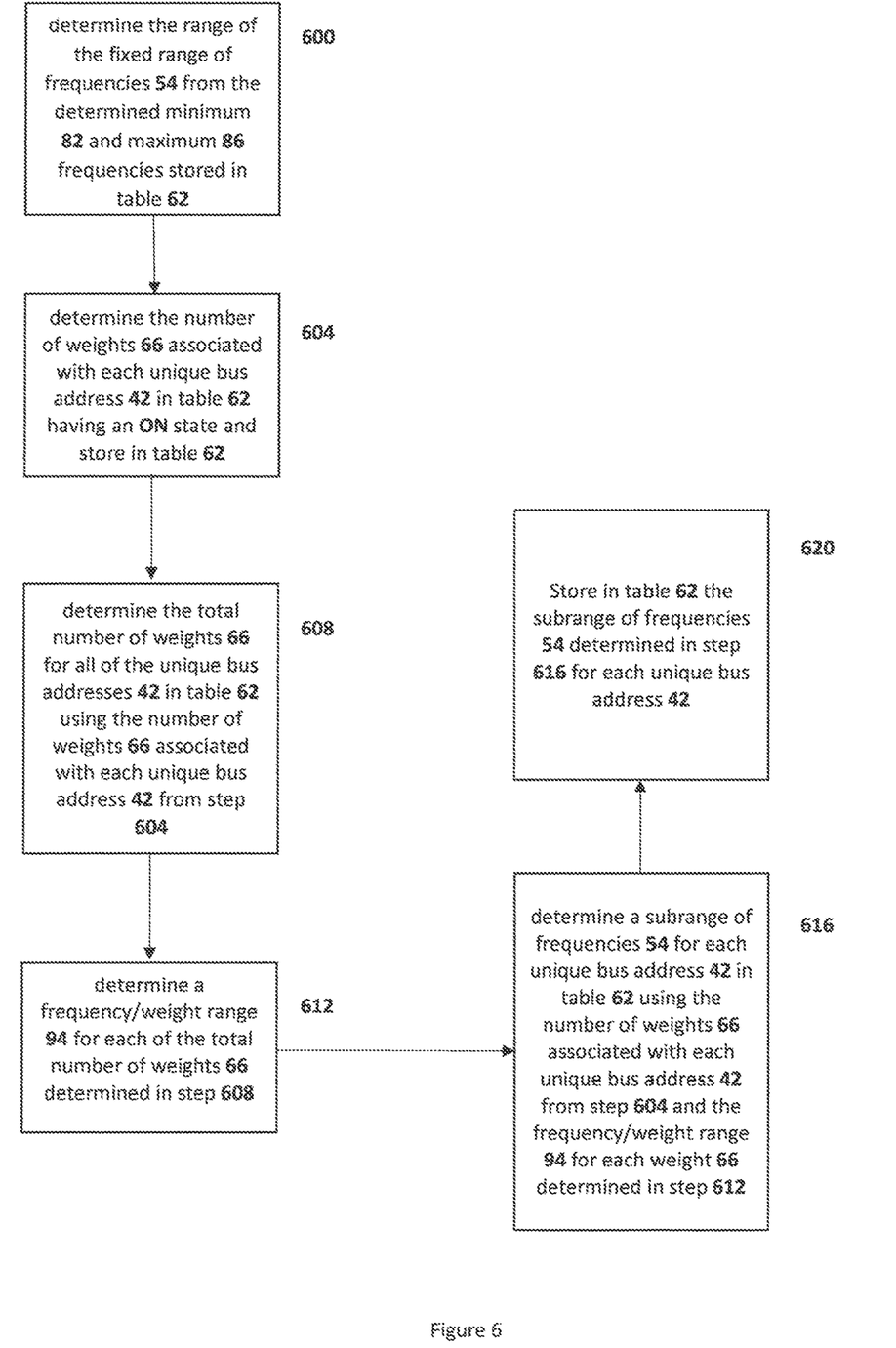
FIG. 6 is a flow chart of the method for determining the range of frequencies for each subranges of frequencies in the fixed range of frequencies.

Referring now to FIG. 6, an algorithm 90 for dynamically determining the subranges of frequency 54 is described in detail. At step 600 the range of the fixed range of frequency 50 is determined by subtracting the minimum frequency 82 stored in table 62 from maximum frequency 86 stored in table 62. At step 604 the total number of weights 66 for each unique bus address 42 is determined. Any unique bus address 42 having an OFF state will have zero weights 66 since the total weighting 66 of each unique bus address 42 is determined by the sum of its weightings 66 times the weigh for its ON or OFF status. For example, in FIG. 3A, address 2 has weightings 66 for a heavy load 106, high current and being a contactor but its status is OFF. Therefore, the total weightings 66 for address 2 would be 3×0=0. At step 608, the total number of weights 66 for all unique bus addresses 42 is determined by summing the total number of weights 66 for each unique bus address 42 in step 604. At step 612, a frequency/weight range 94 is determined by dividing the determined range of frequencies for the fixed range of frequencies 50 from step 600 by the total number of weights 66 for all unique bus addresses 42 having an ON state in step 608. At step 616 a subrange of frequencies 54 for each unique bus address 42 is determined by multiplying the total number of weights 66 for each unique bus address 42 by the frequency/weight range 94 and adding the product to highest frequency of the immediately lower subrange of frequencies 54. For example, in FIG. 3B the determined frequency/weight range 94 is 1.111 Khz per weight 66. This frequency/weight range 94 was determined by dividing the fixed range of frequencies 50 (10 Khz) by the total number of weights 66 for all of the unique bus address 42 having an ON state (9 weights 66). For unique bus address 1 the subrange of frequencies 54 starts at 20 Khz (the minimum frequency 82 of fixed range of frequencies 50) and end at 23.333 Khz ((3×1.111 Khz)+20 Khz). The subrange of frequencies 54 for unique bus address 2 starts at 23.333 Khz (highest frequency for the subrange of frequencies 54 of unique bus address 1) and end at 27.778 Khz ((4×1.111 Khz)+23.333 Khz). The subrange of frequencies 54 for unique bus address 3 starts at 27.778 Khz (highest frequency for the subrange of frequencies 54 of unique bus address 2) and end at 30 Khz, the highest frequency of the fixed range of frequencies 50 ((2×1.111 Khz)+27.778 Khz). At step 620 the determined subrange of frequencies 54 for each switching device 38 is stored in table 62 under the associated unique bus address 42.

We claim:

1. A method for dynamically reducing a peak electromagnetic interference produced by a group of switching devices connected to a common communications bus, the method comprising:

determining a fixed range of frequencies, the fixed range of frequencies including frequencies emitted by each switching device in the group of switching devices during normal operation;

detecting, by a microprocessor, one of the switching devices connected to the communications bus;

determining, by the microprocessor, a bus address of the detected switching device;

determining, by the microprocessor, one or more characteristics associated with each switching device and/or a load controlled by the switching device;

determining, by the microprocessor, a weight associated with each of the characteristics, wherein the weight can be a binary value or a numeric value associated with one or both of a static characteristic of the switching device and/or the load controlled by the switching device or a dynamic characteristic of the switching device and/or the load controlled by the switching device;

determining, by the microprocessor, using the determined weights, a subrange of frequencies associated with each switching device in the group of switching devices;

spreading a peak frequency of each switching device over its associated subrange of frequencies by a timer associated with the switching device and using a maximum and a minimum frequency of the associated subrange of frequencies; and repeating continuously, by the microprocessor, detecting one of the switching devices connected to the communications bus, determining a bus address, determining characteristics, determining weights of the characteristics, the determining a subrange of frequencies associated with each switching device in the group of switching devices and spreading, by the timer, the peak frequency of each switching device over its associated subrange of frequencies.

2. A system for reducing a peak electromagnetic interference produced by each switching device of a group of switching devices connected to a communications bus, the system comprising:

a controller having a microprocessor and a non-transitory memory associated with the microprocessor, the non-transitory memory storing an algorithm for implementation by the microprocessor and characteristics of the switching devices and/or loads controlled by the switching devices;

a fixed range of frequencies, the fixed range of frequencies including frequencies emitted by each switching device in the group of switching devices during normal operation;

a subrange of frequencies associated with each switching device in the group of switching devices, each subrange of frequencies being dynamically determined by the characteristics of its associated switching device and/or the load control led by its associated switching device, the characteristics being indicated by a weight, which can be a binary value or a numeric value associated with one or both of a static characteristic of the switching device and/or the load controlled by the switching device or a dynamic characteristic of the switching device and/or the load controlled by the switching device, the microprocessor configured by the algorithm to continuously update the characteristics of each switching device and/or load, and further configured by the algorithm to dynamically adjust the frequency of the subrange of frequencies associated with each switching device based on the weights of the updated characteristics; and a timer associated with each switching device, the timer configured to use a maximum and a minimum frequency of the subrange of frequencies associated with its associated switching device to spread the peak frequency of that associated switching device over its associated subrange of frequencies.

3. The system of claim 1, wherein the fixed range of frequencies is determined by a user.

4. The system of claim 1, wherein the total frequency range of all subranges of frequencies is contained within the fixed range of frequencies.

5. The system of claim 1, wherein the peak electromagnetic interference produced by the group of switching devices is reduced by reducing the overlapping of frequencies produced by the individual switching devices of the group of switching devices.

6. The system of claim 1, wherein each switching device of the group of switching devices is associated with a unique bus address, wherein the unique bus address is a numeric value or any symbol that can be converted into a numeric value.

7. The system of claim 1, wherein the group of switching devices can include one or more of a power supply, a drive, a motor controller, a soft starter, a protective device or any electrical or electronic device that includes a switching element that can produce an electromagnetic signal during normal operation.

8. The system of claim 1, wherein the static characteristic can be a type of switching device or a type of load controlled by the switching device.

9. The system of claim 1, wherein, the dynamic characteristics can be sensed or determined characteristics including an On or an Off state of the switching device, a current, a voltage, a power, or ranges of the sensed or determined characteristics such as low, medium or high.

10. A method for dynamically reducing a peak electromagnetic interference produced by a group of switching devices connected to a common communications bus, the method comprising:

determining a fixed range of frequencies, the fixed range of frequencies including frequencies emitted by each switching device in the group of switching devices during normal operation;

determining, by a microprocessor, a subrange of frequencies associated with each switching device in the group of switching devices, each subrange of frequencies being dynamically determined by one or more characteristics of its associated switching device and/or a load controlled by its associated switching device, the characteristics being indicated by a weight, which can be a binary value or a numeric value associated with one or both of a static characteristic of the switching device and/or the load controlled by the switching device or a dynamic characteristic of the switching device and/or the load controlled by the switching device; and spreading a peak frequency of each switching device over its associated subrange of frequencies by a timer associated with the switching device and using a maximum and a minimum frequency of the associated subrange of frequencies; and repeating continuously, by the microprocessor, determining the subrange of frequencies associated with each switching device in the group of switching devices and spreading, by the timer, the peak frequency of each switching device over its associated subrange of frequencies.

11. The method of claim 10, wherein the characteristics of each switching device and/or load are continuously updated by the microprocessor.

12. The method of claim 10, wherein the group of switching devices can include one or more of a power supply, a drive, a motor controller, a soft starter, a protective device or any electrical or electronic device that includes a switching element that can produce an electromagnetic signal during normal operation.

13. The method of claim 10, wherein the fixed range of frequencies is determined by a user.

14. The method of claim 10, wherein the total frequency range of all subranges of frequencies is contained within the fixed range of frequencies.

15. The system of claim 10, wherein each switching device of the group of switching devices is associated with a unique bus address, wherein the unique bus address is a numeric value or any symbol that can be converted into a numeric value.

16. The system of claim 10, wherein, the dynamic characteristics can be sensed or determined characteristics including an On or an Off state of the switching device, a current, a voltage, a power, or ranges of the sensed or determined characteristics such as low, medium or high.

17. The method of claim 10, wherein the static characteristic can be a type of switching device or a type of load controlled by the switching device.

\* \* \* \* \*